US006987650B2

(12) United States Patent
Liu et al.

(10) Patent No.: US 6,987,650 B2
(45) Date of Patent: Jan. 17, 2006

(54) DEVICE WITH THERMOELECTRIC COOLING

(75) Inventors: Yue Liu, Fremont, CA (US); Kochan Ju, Monte Sereno, CA (US); Jei-Wei Chang, Cupertino, CA (US); Julie Chen, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 328 days.

(21) Appl. No.: 10/443,358

(22) Filed: May 22, 2003

(65) Prior Publication Data

US 2004/0233584 A1 Nov. 25, 2004

(51) Int. Cl.
G11B 5/39 (2006.01)
F25B 21/02 (2006.01)
F25D 23/12 (2006.01)
H01L 35/28 (2006.01)

(52) U.S. Cl. .............. 360/313; 360/324; 136/203; 136/204; 62/3.7; 62/259.2

(58) Field of Classification Search ............. 360/313, 360/324, 324.1, 324.2; 136/203, 204; 62/3.2, 62/3.3, 3.7, 259.2
See application file for complete search history.

(56) References Cited

U.S. PATENT DOCUMENTS

| | | | |
|---|---|---|---|
| 4,405,961 A * | 9/1983 | Chow et al. ............ | 360/129 |
| 5,627,704 A | 5/1997 | Lederman et al. ....... | 360/113 |
| 5,668,688 A | 9/1997 | Dykes et al. ........... | 360/113 |
| 6,105,381 A | 8/2000 | Ghoshal ................ | 62/259.2 |
| 6,353,318 B1 | 3/2002 | Sin et al. .............. | 324/252 |
| 6,452,740 B1 | 9/2002 | Ghoshal ............... | 360/97.02 |
| 6,597,544 B2 * | 7/2003 | Ghoshal ............... | 360/317 |
| 6,686,532 B1 * | 2/2004 | Macris ................. | 136/204 |
| 2003/0230332 A1 * | 12/2003 | Venkatasubramanian et al. | 136/205 |

FOREIGN PATENT DOCUMENTS

| JP | 63175202 A | * | 7/1988 |
|---|---|---|---|
| JP | 03210489 A | * | 9/1991 |
| JP | 06060335 A | * | 3/1994 |
| JP | 08045026 A | * | 2/1996 |

* cited by examiner

Primary Examiner—William J Klimowicz
(74) Attorney, Agent, or Firm—George O. Saile; Stephen B. Ackerman

(57) ABSTRACT

Increasing the output signal from CPP GMR devices by increasing the read current has not previously been considered an option because it would make the device run too hot. This problem has been overcome by using, for the upper and lower leads, materials that differ significantly in their thermoelectric powers. Thus, when DC is passed through the device, from − to + TEP leads, hot and cold junctions are formed and heat is transferred from the micro-device into the leads, resulting in a net local cooling of the device which enables it to operate at higher power. For a GMR device, this translates to a larger output voltage, making it easier, more sensitive, and more reliable to use.

35 Claims, 2 Drawing Sheets

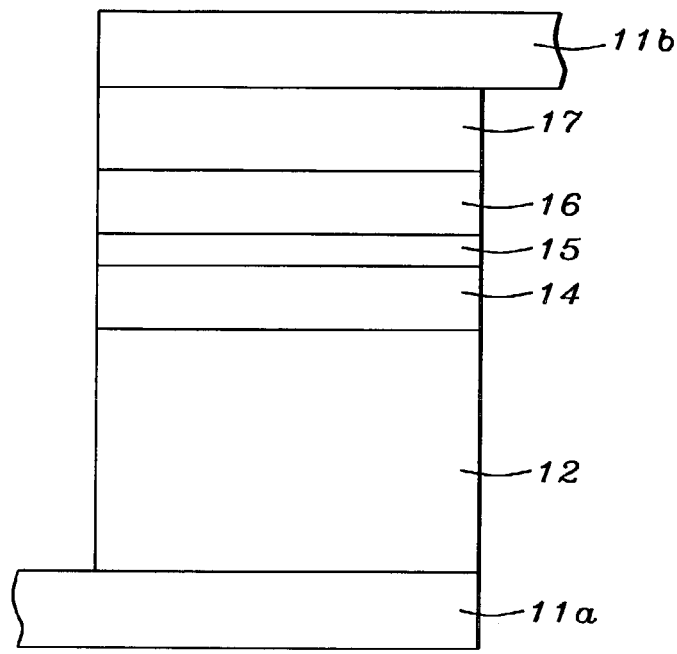
FIG. 1 – Prior Art
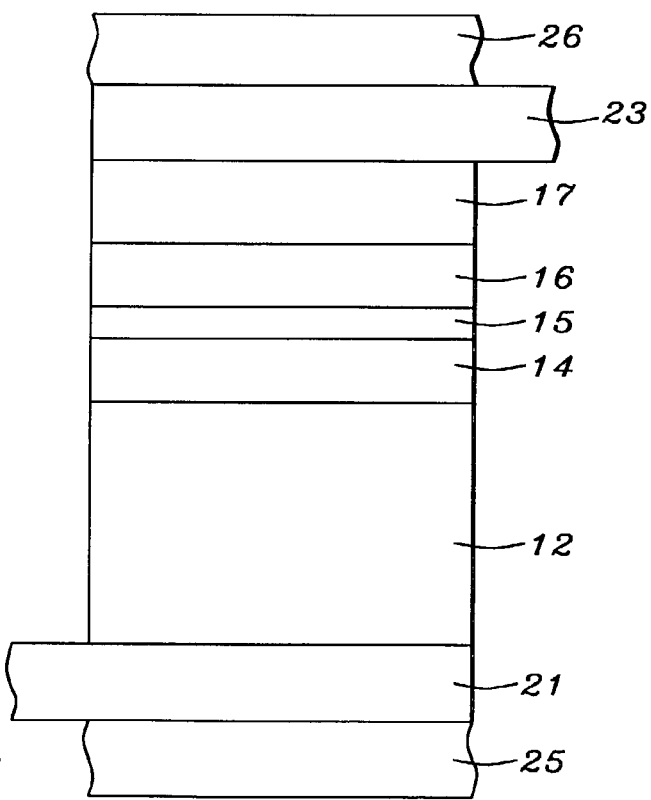
FIG. 2

DEVICE WITH THERMOELECTRIC COOLING

FIELD OF THE INVENTION

The invention relates to the general field of device arrays, particularly memory read heads and most particularly CPP GMR devices with reference to allowing higher operating currents by providing very local cooling.

BACKGROUND OF THE INVENTION

Current perpendicular to plane, giant magneto-resistance (CPP, GMR) read heads are considered as promising candidates for 180 Gb/in² and higher magnetic recording densities. This increase in recording density requires the reduction of the read head dimension. For example, for 180 Gb/in², dimensions around 0.1×0.1 microns are required. A CPP read head can be considered functional only if a significant output voltage, Vout can be achieved when the head senses the magnetic field of a recorded medium. If DR is defined as the resistance change under the magnetic field for the head sensor and I is the current that is sent through the sensor, then $$Vout=DR \times I \quad \text{(Eq. 1)}$$

Almost all attempts by the prior art to increase Vout have focused on ways to increase DR since it has been assumed that I was already at its maximum value, any further increases being expected to lead to unacceptable increases in the operating temperature of the device. The present invention is directed to ways to increase/without raising the operating temperature of the device above acceptable levels.

To increase application current I is as challenging as to increase DR, especially when the device dimension is getting smaller. This is due to the fact that current density J is inversely proportional to the CPP device dimension and Joule heat is proportional to the square of the current density. Device damage from Joule heat will limit the increase of the application current.

The principle governing the operation of most current magnetic read heads is the change of resistivity of certain materials in the presence of a magnetic field (magneto-resistance or MR). Magneto-resistance can be significantly increased by means of a structure known as a spin valve or SV. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

Referring now to FIG. 1, we show there the main features of a CPP GMR read head device. These are an antiferromagnetic (pinning) layer 12, a pinned layer 14, a non-magnetic spacer layer 15, a free layer 16 and a capping layer 17. Additionally there may be a seed layer (not shown) directly below layer 12.

When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field. If the direction of the pinned field is parallel to the free layer, electrons passing between the free and pinned layers, suffer less scattering. Thus, the resistance at this state is lower. If, however, the magnetization of the pinned layer is anti-parallel to that of the free layer, electrons moving from one layer into the other will suffer more scattering so the resistance of the structure will increase. The change in resistance of a spin valve is typically 8–20%.

Previously, GMR devices were designed so as to measure the resistance of the free layer for current flowing parallel to the film's plane. However, as the quest for ever greater densities continues, devices that measure current flowing perpendicular to the plane (CPP) have begun to emerge. For devices depending on in-plane current, the signal strength is diluted by parallel currents flowing through the other layers of the GMR stack, so these layers should have resistivities as high as possible while the resistance of the leads into and out of the device need not be particularly low. By contrast, in a CPP device, the resistivity of both the leads and the other GMR stack layers dominate and should be as low as possible.

A related device that is particularly well suited to the CPP design is the magnetic tunneling junction (MTJ) in which the layer that separates the free and pinned layers is a non-magnetic insulator, such as alumina or silica. Its thickness needs to be such that it will transmit a significant tunneling current. The principle governing the operation of the MTJ is the change of resistivity of the tunnel junction between two ferromagnetic layers. When the magnetization of the two ferromagnetic layers is in opposite directions, the tunneling resistance increases due to a reduction in the tunneling probability. The change of resistance is typically about 40%.

Returning now to FIG. 1, it can be seen that current enters the device through lead 11a and exits through lead 11b (or vice versa if convention demands). It is important to note that, in prior art devices, 11a and 11b are invariably formed from the same material, most typically copper or gold, selected for their high electrical conductivity. There is no reason to use different materials since this would only ad to the cost.

A routine search of the prior art was performed with the following references of interest being found:

In U.S. Pat. Nos. 6,452,740 and 6,105,381, Ghoshal describes devices connected to micro-coolers. Sin et al (U.S. Pat. No. 6,353,318) is an example of the many patents that disclose top and bottom leads composed of the same materials. U.S. Pat. No. 5,627,704 (Lederman et al) and U.S. Pat. No. 5,668,688 (Dykes et al) show a CPP mode read head.

SUMMARY OF THE INVENTION

It has been an object of at least one embodiment of the present invention to incorporate thermoelectric cooling in a CPP device thereby increasing its current carrying capability.

Another object of at least one embodiment of the present invention has been that said increased current cause an increased output voltage amplitude in a device such as a CPP GMR magnetic read head.

Still another object of at least one embodiment of the present invention has been that said thermoelectric cooling be achieved without the addition of any additional parts to the device or devices for which it is used.

A further object of at least one embodiment of the present invention has been that said thermoelectric cooling be capable of cooling a single micro-device without influencing its immediate neighbors.

Yet another object of at least one embodiment of the present invention has been to provide a process for manufacturing said cooling system.

These objects have been achieved by using different materials for the upper and lower leads of the CPP device. More specifically, said materials are selected so that they differ significantly in their TEPs (thermoelectric powers). The result is that when DC is passed through the device hot and cold junctions are formed. Heat from the hot junction is removed by the substrate, resulting in a net local cooling of the device which enables it operate at higher power. For a GMR device, this translates to a larger output voltage, making the device easier, more sensitive, and more reliable to use.

BRIEF DESCRIPTION OF THE DRAWINGS

FIG. 1 shows a CPP GMR device of the prior art.

FIG. 2 shows a CPP GMR device built according to the teachings of the present invention.

DESCRIPTION OF THE PREFERRED EMBODIMENTS

Figure 3:
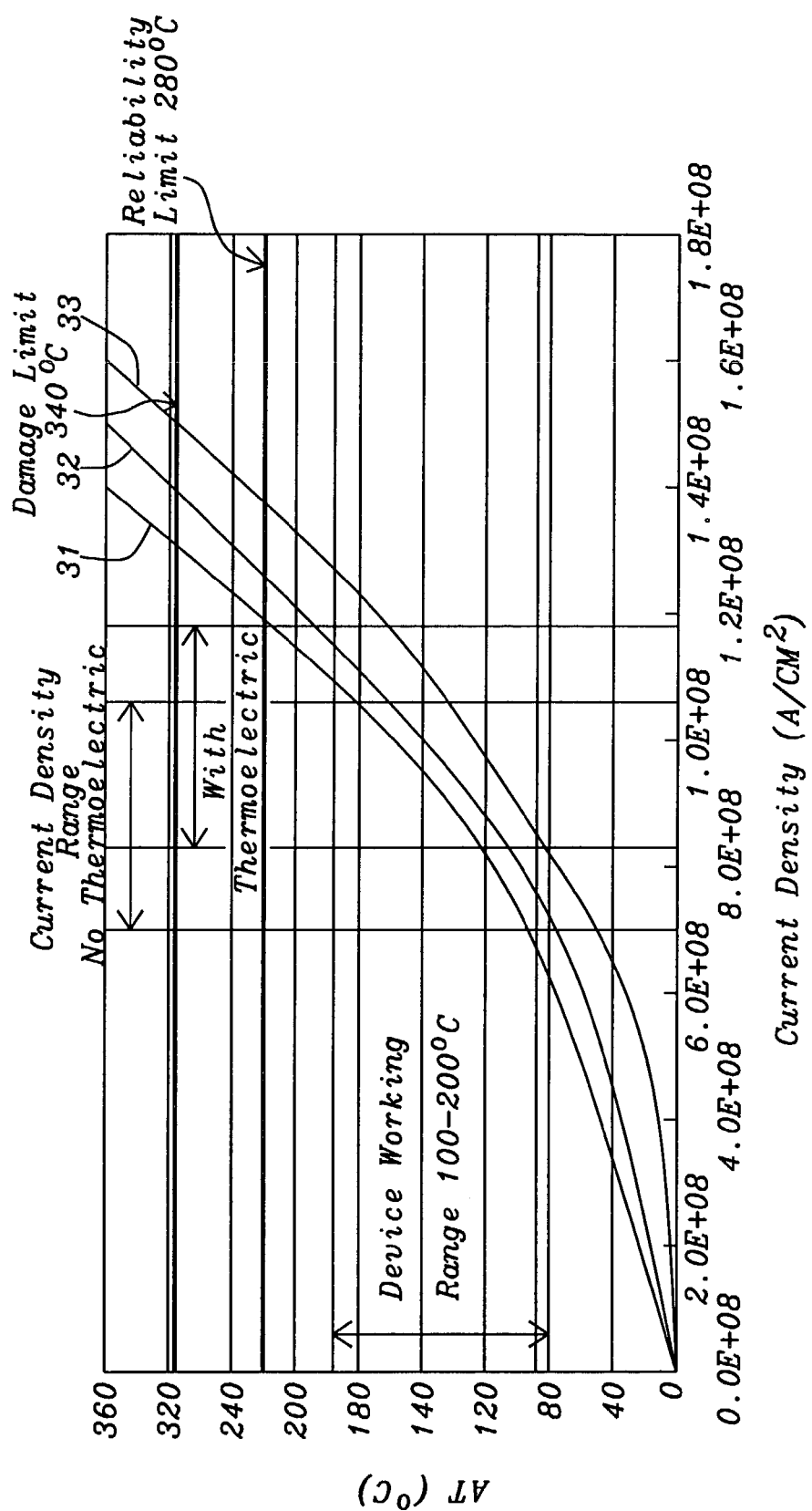
FIG. 3 is a plot of device temperature as a function of current density.

Thermoelectrics are based on the Peltier Effect, discovered in 1834, in which DC current, applied across two dissimilar materials, causes a temperature differential. The Peltier Effect is one of three thermoelectric effects, the other two being the Seebeck Effect and the Thomson Effect. The latter effect acts on a single conductor, the Peltier Effect is typically a junction phenomenon, while the Seebeck effect is responsible for the Peltier and Thomson effects in the absence of an applied voltage.

Thermoelectric modules are widely available and usually comprise two thin ceramic wafers with a series of P and N doped bismuth-telluride semiconductor material sandwiched between them. The N type material has an excess of electrons, while the P type material has a deficit of electrons. As the electrons move from the P type material to the N type material, the electrons must enter a higher energy state. The energy to achieve this is extracted from the surrounding lattice so the local temperature is reduced (creating the cold junction). When the other junction is reached, the electrons now enter a lower energy state, returning to the local lattice the energy acquired when they crossed the first junction, in the form of heat (creating the hot junction).

Thermoelectrics may be used both to heat and to cool. In the latter case, some sort of heat sink needs to be provided for the hot junction in order to maintain significant cooling of the cold junction over time.

Although thermoelectric junctions are most effective when formed between semiconductors of opposite conductivity type, they can still be effective when made between two metals. An indication as to which metals are most effective for use in forming thermoelectric junctions may be obtained by reviewing the EMFs generated by them when used as thermocouples.

Some typical data has been summarized in TABLE I below (Pt was one side of all couples):

TABLE I

| Material | EMF at 100° C. mV | EMF at 200° C. mV |
|---|---|---|
| Cu | 0.76 | 1.83 |
| Al | 0.42 | 1.06 |
| Ni | −1.48 | −3.10 |
| Pd | −0.57 | −1.23 |
| Ag | 0.74 | 1.77 |
| Alumel | −1.29 | −2.17 |
| Chromel | 2.81 | 5.96 |
| Constantan | −3.51 | −7.45 |
| Fe | 1.89 | 3.54 |
| $Pt_{90}Rh_{10}$ | 0.643 | 1.44 |

It follows that by combining a metal with a high positive TEP (thermoelectric power) with one having a high negative TEP, an effective heating/cooling combination will be obtained. It is important to note that, while thermoelectric cooling of electrical equipment is not new, prior approaches have always required the addition of additional circuitry and materials to the structure that is being cooled. Also, the present invention is capable of cooling a single micro-device. The latter, typically, has a cross-sectional area less than about 0.4 sq. microns although cross-sectional areas less than about 0.01 sq. microns could still be effectively handled. The invention will be effective even if the object being cooled should happen to be located in the midst of other structures that are not to be cooled.

We will now describe the invention in greater detail. We have chosen to use a CPP GMR structure as our exemplary vehicle but it will be understood that the invention is more general than this and could be applied to the very local cooling of any micro-device that is operated either wholly or in part by direct current.

Referring now to FIG. 2, the process of the present invention begins with the provision of heat sink 25. Said heat sink may be specially added to the structure to perform its special function or it may simply be the existing substrate on which the micro-device is to be formed. A layer of conductive material is then deposited (to a thickness of between about 0.1 and 3 microns) and patterned to form lower conducting lead 21. Some examples of materials that could be used for lead 21 include, but are not limited to NiCu (constantan), NiFe, Ni, Co, Pd, Pt, PdAg, PtRh, and NiMnAlSi (alumel).

Next, a GMR stack is formed after the sequential deposition of antiferromagnetic layer 12, pinned layer 14, non-magnetic spacer layer 15, free layer 16, and capping layer 17. Note that if non-magnetic layer 15 is electrically conductive the micro-device is a spin valve. If, instead, layer 15 is insulating (as well as thin enough to allow tunneling) the micro-device is a magnetic tunnel junction.

This is followed by the deposition, on capping layer 17, of a second a layer of conductive material (to a thickness of between about 0.1 and 3 microns) out of which top conductive lead 23 is then formed. As a key feature of the invention, the material of lead 23 has a different thermoelectric power from that used to form lower lead 21, resulting in the formation of a thermoelectric structure. Some examples of materials that could be used for lead 23 include, but are not limited to NiCr, Mo, W, Cu, Ag Au, U, V, Yb, and $CePd_3$.

Heat sink 26 is seen to be positioned over lead 23. Layer 23 may be specially provided to serve the heat sinking function or it may be a natural part of the full structure such as the lower magnetic shield of the write head.

Note that, depending on the DC polarity that is most suited to for operating the device, the two groups of materials (suitable for the upper and lower leads respectively) may be reversed. Also, choosing a particular material from one of the groups will, to some extent, dictate which material is selected from the other group. Some examples of pairs of materials that are suitable for effective cooling include, but are not limited to, NiCr(+)/NiCu(−), NiCr(+)/NiFe(−), and Cu(+)/NiFe(−).

Thus, when DC is applied in the appropriate direction between leads 21 and 23, heat will be removed from the micro-device between these leads and passed thence into the heat sink (explicit or implicit), thereby enabling the device (in this example a GMR-based read head for a memory micro-device) to operate, without excessive heating, at a higher power level than would be possible if leads 21 and 23 were made from the same material.

Confirmatory Results:

In order to demonstrate the effectiveness of the invention, three different structures were built and examined and the maximum current density at which they could be safely operated was determined. For all three cases, the top lead was made of Cu(+TEP) while the bottom lead was NiFe (−TEP).

The results are shown in TABLE II below. Details of the criteria determining safe operating conditions can be seen in FIG. 3 where curve 31 correspond to the + current case in which current flows from +TEP Cu to −TEP NiFe, thereby causing heat to be absorbed by the heat sink. The − current case where current flowed from −TEP NiFe to +TEP Cu is represented by curve 33, while curve 32 is for the case where top and bottom leads were of the same material

TABLE II

| device type | +current $10^8$ A/cm$^2$ | −current $10^8$ A/cm$^2$ | ratio |
| --- | --- | --- | --- |
| metal CPP1 | 1.04 | 1.35 | 1.30 |
| metal CPP2 | 1.08 | 1.36 | 1.26 |
| CPP (NOL on FL) | 0.751 | 1.18 | 1.57 |

FL = free layer;
NOL = nano-oxide layer (used to increase CPP resistance)

As is readily seen, an improvement of over 50% in the maximum safe operating current density is obtainable through application of the principles of the present invention. For micro-devices, the main application area of the invention, this corresponds to being able to operate at a power level of at least $1\times10^4$ microwatts per square micron.

What is claimed is:

1. A method to improve heat dissipation in a micro-device, comprising:
   connecting a first lead, made of a first material, to a bottom surface of said micro-device;
   connecting a second lead, made of a second material having a different thermoelectric power from said first material, to a top surface of said micro-device, thereby forming a thermoelectric structure in which said micro-device is located between a pair of dissimilar metal junctions;
   connecting to at least one heat sink; and
   operating said micro-device using direct current that flows in a direction that causes heat generated within the micro-device to be absorbed by said heat sink, whereby the micro-device is able to operate at a higher power level than would be possible in the absence of said thermoelectric structure.

2. The method described in claim 1 wherein said first material is selected from the group consisting of NiCu, NiFe, Ni, Co, Pd, Pt, PdAg, PtRh, and NiMnAlSi.

3. The method described in claim 1 wherein said second material is selected from the group consisting of NiCr, Mo, W, Cu, Ag Au, U, V, Yb, and CePd$_3$.

4. The method described in claim 1 wherein said first material is NiCu or NiFe and said second material is NiCr or Cu.

5. The method described in claim 1 wherein said micro-device is a magnetic read element.

6. The method described in claim 1 wherein said higher power level is at least $1\times10^4$ microwatts per square micron.

7. A process to manufacture a magnetic memory reading micro-device, comprising:
   providing a heat sink;
   depositing on said heat sink a layer of a first conductive material and then patterning said first layer to form a lower conducting lead;
   depositing an antiferromagnetic layer on said lower conducting lead;
   depositing a pinned layer on said antiferromagnetic layer;
   depositing a non-magnetic layer on said pinned layer;
   depositing a free layer on said non-magnetic layer;
   depositing a capping layer on said free layer;
   patterning said antiferromagnetic, pinned, non-magnetic, free, and capping layers to form a GMR stack;
   depositing on said capping layer a layer of a second conductive material having a different thermoelectric power from said first material thereby forming a thermoelectric structure in which said micro-device is located between a pair of dissimilar metal junctions; and
   patterning said layer of a second conductive material to form an upper conducting lead whereby, when said memory micro-device is operated, heat is transferred from said micro-device into said lower lead and thence into said heat sink, thereby enabling the memory micro-device to operate, without excessive heating, at a higher power level than would be possible in the absence of said thermoelectric structure.

8. The process described in claim 7 wherein said first material is selected from the group consisting of NiCu, NiFe, Ni, Co, Pd, Pt, PdAg, PtRh, and NiMnAlSi.

9. The process described in claim 7 wherein said second material is selected from the group consisting of NiCr, Mo, W, Cu, Ag Au, U, V, Yb, and CePd$_3$.

10. The process described in claim 7 wherein said first material is NiCu or NiFe and said second material is NiCr or Cu.

11. The process described in claim 7 wherein said non-magnetic layer is electrically conductive, whereby said micro-device is a CPP GMR magnetic read element.

12. The process described in claim 7 wherein said non-magnetic layer is a dielectric layer, whereby said micro-device is a magnetic tunnel junction.

13. The process described in claim 7 wherein said higher power level is at least $1\times10^4$ microwatts per square micron.

14. The process described in claim 7 wherein said layer of a first material is deposited to a thickness of between about 0.1 and 3 microns.

15. The process described in claim 7 wherein said layer of a second material is deposited to a thickness of between about 0.1 and 3 microns.

16. The process recited in claim 7 wherein said non-magnetic layer that is deposited on said pinned layer is a nano-oxide layer.

17. A micro-device, comprising:
a first lead, made of a first material and connected to a bottom surface of said micro-device;
a second lead, made of a second material having a different thermoelectric power from said first material and connected to a top surface of said micro-device, whereby said micro-device includes a thermoelectric structure having leads made of dissimilar metals; and
heat sinks in contact with said leads, whereby the micro-device is able to operate, without excessive heating, at a higher power level than would be possible in the absence of said thermoelectric structure.

18. The micro-device described in claim 17 wherein said first material is selected from the group consisting of NiCu, NiFe, Ni, Co, Pd, Pt, PdAg, PtRh, and NiMnAlSi.

19. The micro-device described in claim 17 wherein said second material is selected from the group consisting of NiCr, Mo, W, Cu, Ag Au, U, V, Yb, and $CePd_3$.

20. The micro-device described in claim 17 wherein said first material is NiCu or NiFe and said second material is NiCr or Cu.

21. The micro-device described in claim 17 wherein said micro-device is a magnetic read element.

22. The micro-device described in claim 17 wherein said higher power level is at least $1 \times 10^4$ microwatts per square micron.

23. The micro-device described in claim 17 wherein said heat sink is a substrate bearing an array of said micro-devices.

24. A magnetic memory reading micro-device, comprising:
a heat sink;
on said heat sink, a layer of a first material in the form of a lower conducting lead;
an antiferromagnetic layer on said lower conducting lead;
a pinned layer on said antiferromagnetic layer;
a non-magnetic layer on said pinned layer;
a free layer on said non-magnetic layer;
a capping layer on said free layer;
said antiferromagnetic, pinned, non-magnetic, free, and capping layers having been patterned to form a GMR stack;
on said capping layer a layer of a second material having a different thermoelectric power from said first material whereby said memory micro-device includes a thermoelectric structure in which said micro-device is located between a pair of dissimilar metal junctions; and
said layer of a second material having the form an upper conducting lead whereby, when said memory micro-device is operated, heat is transferred from said leads into said heat sinks, thereby enabling the memory micro-device to operate, without excessive heating, at a higher power level than would be possible in the absence of said thermoelectric structure.

25. The magnetic memory reading micro-device described in claim 24 wherein said first material is selected from the group consisting of NiCu, NiFe, Ni, Co, Pd, Pt, PdAg, PtRh, and NiMnAlSi.

26. The magnetic memory reading micro-device described in claim 24 wherein said second material is selected from the group consisting of NiCr, Mo, W, Cu, Ag Au, U, V, Yb, and $CePd_3$.

27. The magnetic memory reading micro-device described in claim 24 wherein said first material is NiCu or NiFe and said second material is NiCr or Cu.

28. The magnetic memory reading micro-device described in claim 24 wherein said non-magnetic layer is electrically conductive, whereby said micro-device is a CPP GMR magnetic read element.

29. The magnetic memory reading micro-device described in claim 24 wherein said non-magnetic layer is a dielectric layer, whereby said micro-device is a magnetic tunnel junction.

30. The magnetic memory reading micro-device described in claim 24 wherein said higher power level is at least $1 \times 10^4$ microwatts per square micron.

31. The magnetic memory reading micro-device described in claim 24 wherein said layer of a first material is deposited to a thickness of between about 0.1 and 3 microns.

32. The magnetic memory reading micro-device described in claim 24 wherein said layer of a second material is deposited to a thickness of between about 0.1 and 3 microns.

33. The micro-device described in claim 24 wherein said heat sink is a substrate bearing an array of said micro-devices.

34. The micro-device described in claim 24 wherein said heat sink is a magnetic shield that is part of a magnetic write head.

35. The magnetic memory reading micro-device described in claim 24 wherein said non-magnetic layer on said pinned layer is a nano-oxide layer.

* * * * *